US012772631B2

(12) United States Patent
Chiu et al.

(10) Patent No.: US 12,772,631 B2
(45) Date of Patent: Oct. 20, 2026

(54) LIGHT-EMITTING MODULE

(71) Applicant: InnoLux Corporation, Miao-Li County (TW)

(72) Inventors: Yu-Chun Chiu, Miao-Li County (TW); Ai-Ling Kuo, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 445 days.

(21) Appl. No.: 18/328,931

(22) Filed: Jun. 5, 2023

(65) Prior Publication Data

US 2024/0014361 A1 Jan. 11, 2024

(30) Foreign Application Priority Data

Jul. 7, 2022 (CN) ......................... 202210802673.3

(51) Int. Cl.

*H10H 20/856* (2025.01)
*G02F 1/13357* (2006.01)
*G09F 9/33* (2006.01)
*H01L 25/075* (2006.01)
*H10H 20/80* (2025.01)
*H10H 20/855* (2025.01)

(52) U.S. Cl.

CPC ....... *H10H 20/856* (2025.01); *H01L 25/0753* (2013.01)

(58) Field of Classification Search

CPC ......... G02F 1/133603; G02F 1/133605; G09F 9/33; H10H 20/856; H01L 25/0753
See application file for complete search history.

(56) References Cited

U.S. PATENT DOCUMENTS 11,480,828 B1 * 10/2022 Wang ................ G02F 1/133606
2008/0198597 A1 * 8/2008 Blumel ................... G09F 13/14 362/247
2011/0051037 A1 * 3/2011 Kim .................. G02F 1/133603 362/235
2016/0004123 A1 * 1/2016 Tanabe ............. G02F 1/133611 362/97.3
2017/0219882 A1 * 8/2017 Kang ................ G02F 1/133605

FOREIGN PATENT DOCUMENTS

CN 106226950 A * 12/2016 ....... G02F 1/133605
CN 107015402 A 8/2017
CN 109061947 A 12/2018
CN 208621882 U 3/2019
CN 114624920 A * 6/2022 ....... G02F 1/133608
TW 202111355 A 3/2021

OTHER PUBLICATIONS

Chinese language office action dated May 2, 2025, issued in application No. TW 112109322.
Chinese language office action dated Jan. 29, 2026, issued in application No. CN 202210802673.3.

* cited by examiner

*Primary Examiner* — Antonio B Crite
(74) *Attorney, Agent, or Firm* — McClure, Qualey & Rodack, LLP

(57) ABSTRACT

A light-emitting module is provided. The light-emitting module includes a backplane, a light-emitting element, and a reflector. The light-emitting element is disposed on the backplane. The reflector is disposed on the backplane and adjacent to the light-emitting element. The reflector includes a bottom surface and a side surface surrounding the bottom surface. The side surface has a plurality of light-absorbing elements.

19 Claims, 12 Drawing Sheets

100

LIGHT-EMITTING MODULE

CROSS REFERENCE TO RELATED APPLICATIONS

This Application claims priority of China Patent Application No. 202210802673.3, filed on Jul. 7, 2022, the entirety of which is incorporated by reference herein.

BACKGROUND OF THE INVENTION

Field of the Invention

The present disclosure relates to an electronic device. In particular, the present disclosure relates to an electronic device that is able to emit light.

Description of the Related Art

As technology has improved, electronic devices that are able to display images and video (examples of electronic devices include a tablet computer, a notebook, a smartphone, a display device, a television, and the like) grow in popularity. For electronic devices that are able to display images and video, non-uniform illumination may disappoint users and cause poor user experience. Therefore, it is crucial to enhance illumination uniformity of these electronic devices.

BRIEF SUMMARY OF THE INVENTION

According to some embodiments of the present disclosure, a light-emitting module is provided. The light-emitting module includes a backplane, a light-emitting element, and a reflector. The light-emitting element is disposed on the backplane. The reflector is disposed on the backplane and adjacent to the light-emitting element. The reflector includes a bottom surface and a side surface surrounding the bottom surface. The side surface has a plurality of light-absorbing elements.

BRIEF DESCRIPTION OF THE DRAWINGS

The present disclosure may be more fully understood by reading the following description and examples with references made to the accompanying drawings. It should be noted that, various features may be not drawn to scale. In fact, the dimensions of the various features may be arbitrarily increased or decreased for clarity of discussion, and the various features may be drawn schematically.

DETAILED DESCRIPTION OF THE INVENTION

Figure 1:
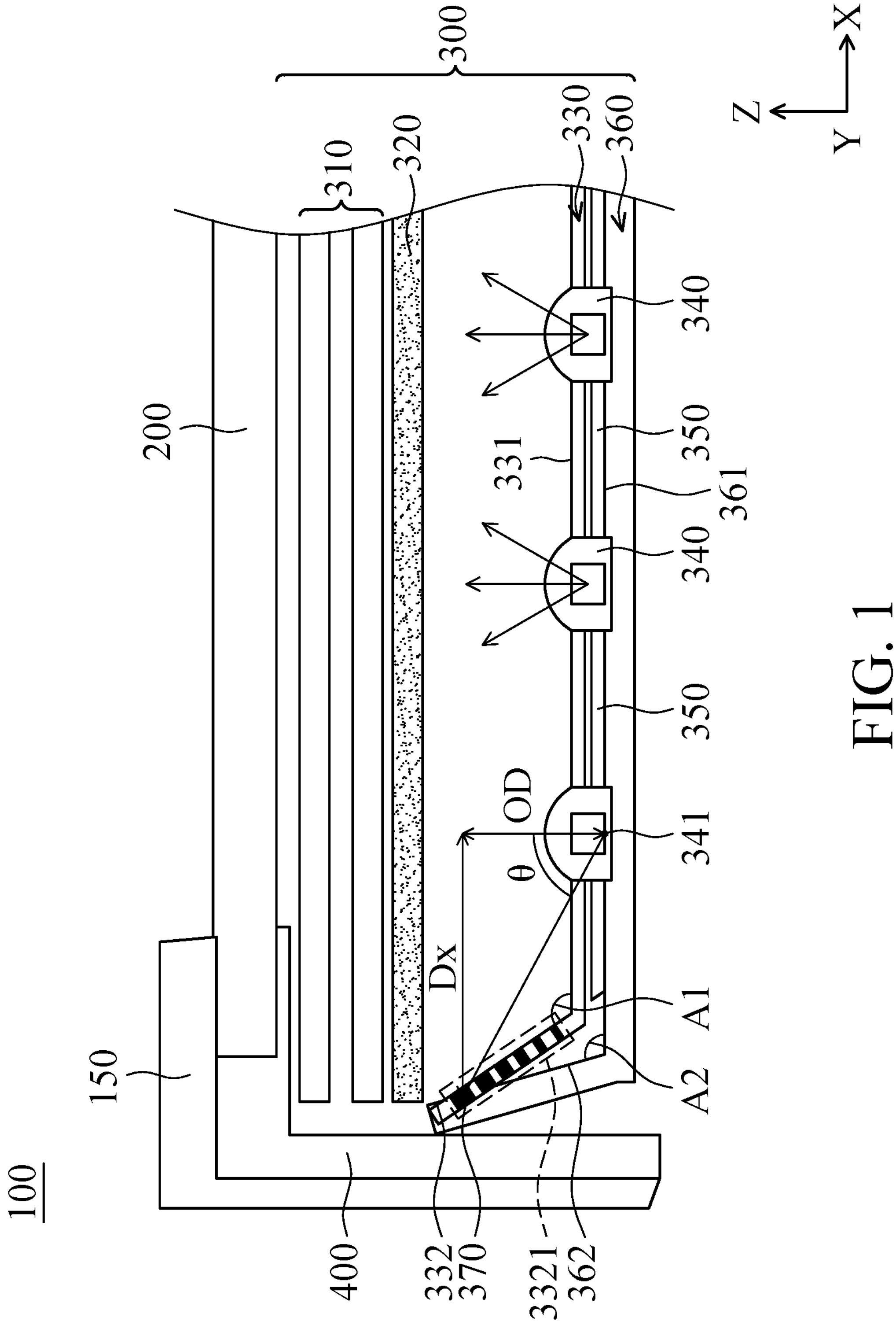
FIG. 1 is a side view of the electronic device, in accordance with some embodiments of the present disclosure.

The following description provides many different embodiments for implementing different features of the present disclosure. Specific elements and arrangements described in the following description are some embodiments of the present disclosure for clarity of discussion. These are used merely as examples and do not limit the scope of the present disclosure. In addition, in different embodiments, similar and/or corresponding symbols or alphabets may be used to denote similar and/or corresponding elements to clearly describe the present disclosure. However, these similar and/or corresponding symbols or alphabets are used for the sake of clear description of some embodiments of the present disclosure, and they do not dictate any relationship between different embodiments and/or structures. Ordinal terms such as "first", "second", etc., used in the following description do not by themselves connote any priority, precedence, or order of one element over another, but are used merely as labels to distinguish one element from another element having the same name. Therefore, a first element in the description may be referred to as a second element in claims.

The present disclosure may be understood from the following description in accompany with the drawings. The number and sizes of elements illustrated in the drawings are merely example and do not limit the scope of the present application. It should be noted that, the elements and the devices may exist in various forms. In the description, relative expressions may be used. For example, "higher" and "lower" may be used to describe the position of one element relative to another element. It should be noted that, if a device of the drawings is flipped upside down, an element that is "higher" will become an element that is "lower". Also, the formation of a first feature over or on a second feature may include embodiments in which the first and second features are formed in direct contact, and may also include embodiments in which additional features may be formed between the first feature and the second feature, such that the first feature and the second feature may not be in direct contact.

In the description, the words "including", "comprising", "having", and the like are open words, so they should be interpreted as meaning "including but not limited to . . . ". Therefore, when the words "including", "comprising", "having", and the like are used in the description of this disclosure, the presence of corresponding features, regions, steps, operations and/or elements is specified, and without excluding the presence of one or more other features, regions, steps, operations and/or elements. Also, in the description, the words "about" or "substantially" are generally interpreted as within 10%, 5%, 3%, 2%, 1%, or 0.5% of a given value or range. In addition, the word "the range is between a first value and a second value" represents the range includes the first value, the second value, and other values between the first value and the second value.

It should be noted that various changes, substitutions, and alterations may be made to the embodiments herein without departing from the spirit and scope of this disclosure to accomplish other embodiments. As long as the features of different embodiments do not depart from the spirit and scope of this disclosure, the features may be arbitrarily combined.

Furthermore, the electronic device of some embodiments of the present disclosure may include a display device, a backlight device, a touch device, an antenna device, a sensing device, or a tiled device, but it is not limited thereto. The electronic device may include a bendable or a flexible electronic device. The display device may be self-emissive display device or a self-emitting display device, but it is not limited thereto. The antenna device may be a liquid crystal (LC) type antenna device or a non-liquid crystal-type antenna device, but it is not limited thereto. The sensing device may be a sensing device that is capable of sensing capacitance, light, thermal energy, or ultrasonic sounds, but it is not limited thereto. The electronic element may include a passive element and an active element, such as a capacitor, a resistor, an inductor, a diode, a transistor, and the like. The diode may include a light-emitting diode (LED) or a photodiode. The light-emitting diode may include an organic light-emitting diode (OLED), an inorganic light-emitting diode, a mini LED, a micro LED, or a quantum dot (QD) LED (QDLED, which may also be referred to as QLED), but it is not limited thereto. The tiled device may be a display tiled device or antenna tiled device, but it is not limited thereto. It should be noted that the electronic device may be combinations of the aforementioned electronic devices, but it is not limited thereto. In the following description, the display device or the tiled device may be used as an example of the electronic device, but the present disclosure is not limited thereto.

Figure 2:
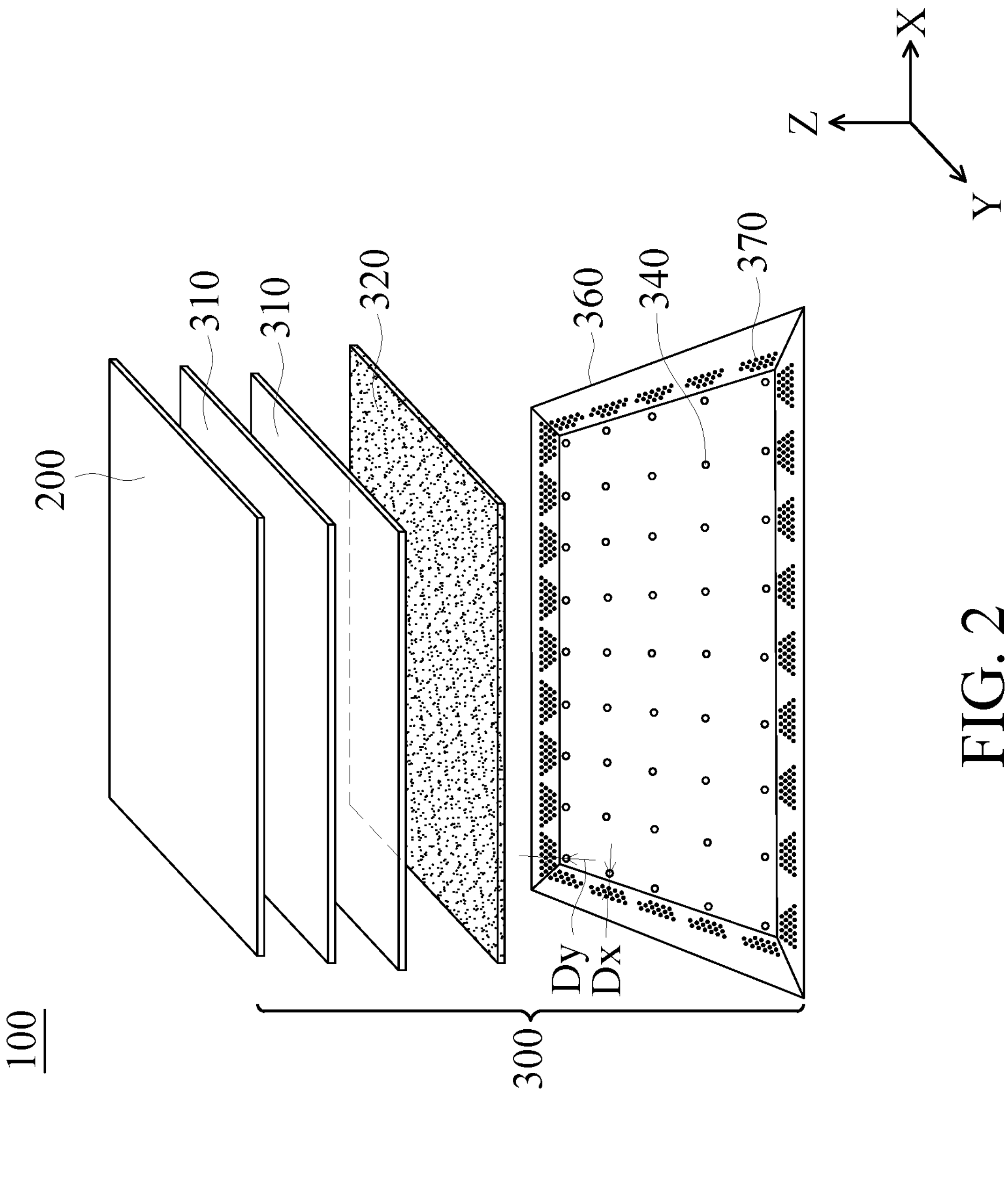
FIG. 2 is an exploded view of the electronic device, in accordance with some embodiments of the present disclosure.

Please refer to FIG. 1 and FIG. 2 to understand an electronic device 100. FIG. 1 is a side view of the electronic device 100, in accordance with some embodiments of the present disclosure. FIG. 2 is an exploded view of the electronic device 100, in accordance with some embodiments of the present disclosure. The electronic device 100 includes a housing 150, a display panel 200, a light-emitting module 300, and a frame 400. The frame 400 may be disposed between the display panel 200 and the light-emitting module 300, and the frame 400 may be able to affix the display panel 200. The light provided by the light-emitting module 300 may pass through the display panel 200 and enter users' eyes.

The display panel 200 is disposed above the light-emitting module 300. The display panel 200 includes, for example, two substrates (not shown), a display medium layer (not shown), a driving circuit layer (not shown), and the like. The display medium layer may be disposed between the two substrates. The material of the two substrates may include glass, quartz, polycarbonate (PC), polyimide (PI), polypropylene (PP), polyethylene terephthalate (PET), other suitable materials, and a combination thereof, but it is not limited thereto. The driving circuit layer may include a transistor (such as a switching transistor, a driving transistor or another transistor), a data line, a scan line, a dielectric layer, or another line or layer, but it is not limited thereto. The display medium layer may include liquid crystal or a light-emitting diode. For example, the type of liquid crystal may include twisted nematic (TN) liquid crystal, super-twisted nematic (STN) liquid crystal, vertical alignment (VA) liquid crystal, in-plane switching (IPS) liquid crystal, cholesteric liquid crystal, fringe field switching (FFS) liquid crystal, another suitable liquid crystal, or a combination thereof, but it is not limited thereto. For example, the LED may include an OLED, a mini LED, a micro LED, or a QDLED, but it is not limited thereto.

The light-emitting module 300 is disposed under the display panel 200. The light-emitting module 300 may include an optical film group 310, a diffuser film group 320, a reflector 330, a plurality of light-emitting elements 340, a connecting element 350, a backplane 360, and a plurality of light-absorbing elements 370.

The optical film group 310 is disposed between the display panel 200 and the light-emitting elements 340. The optical film group 310 may include one or more optical films. In some embodiments, any two adjacent optical films may or may not be in contact with each other. For example, there may be an air layer or one or more layers (or elements) between any two adjacent optical films, such as an adhesive layer, but it is not limited thereto. The diffuser film group 320 is disposed between the display panel 200 and the light-emitting elements 340. The diffuser film group 320 may include one or more diffuser films. Diffuser films may be made from a variety of methods or materials. In some embodiments, the diffuser films may be made by coating a light-diffusing mixed material layer on the optical films or by forming a concave-convex structure on the surfaces of the optical films. In some embodiments, the diffuser films may be made by adding scattering particles or diffusing particles or refracting particles inside the optical films or by doping hollow beads or polymer particles filled with air or gas inside the optical films. In some embodiments, the diffuser films may be optical films with micro-hole structure inside. The methods for manufacturing the diffuser films are not limited thereto. In some embodiments, one or more diffuser films of the diffuser film group 320 may be disposed between two or more optical films of the optical film group 310.

The reflector 330 is disposed above the backplane 360 and adjacent to the light-emitting elements 340. The reflector 330 may be used for reflecting light or change the path of light. In some embodiments, the reflector 330 may include materials with high reflectivity (including white coating, metallic coating, reflective particles or other materials with reflective properties, but the materials are not limited thereto). The reflective particles may have different particle sizes or different materials. For example, the reflective particles may be composite materials, such as titanium dioxide ($TiO_2$), silicon dioxide ($SiO_2$), aluminum oxide ($Al_2O_3$) or zinc oxide (ZnO), but the materials of the reflective particles are not limited thereto. In some embodiments, the reflector 330 has a boat-shaped structure. For example, the reflector 330 includes a bottom surface 331 and a side surface 332 surrounding the bottom surface 331. In some embodiments, the side surface 332 is inclined at an inclination angle A1 relative to the bottom surface 331, and the inclination angle A1 is greater than or equal to 100 degrees and less than or equal to 170 degrees (100 degrees≤inclination angle A1≤170 degrees).

The light-emitting elements 340 are disposed on the backplane 360 and adjacent to the reflector 330. The light-emitting elements 340 may include a LED. The LED may include, for example, an OLED, a mini LED, a micro LED, or a QDLED, but it is not limited thereto. The connecting element 350 is disposed between the reflector 330 and the backplane 360. The connecting element 350 is used for connecting the light-emitting elements 340. In some embodiments, the connecting element 350 is strip-shaped.

The backplane 360 is the bottommost element of the electronic device 100. The backplane 360 may be used for heat dissipation or support. In some embodiments, the backplane 360 may include plastic, metal (including stainless steel, aluminum alloy, other metals, or other metal alloys), ceramics, other suitable materials, or a combination thereof, but it is not limited thereto. The backplane 360 may be made by injection molding, insert molding, stamping, or other suitable methods, but the methods for manufacturing the backplane 360 are not limited thereto. In some embodiments, the backplane 360 is boat-shaped. For example, the backplane 360 includes a backplane bottom surface 361 and a backplane side surface 362 surrounding the backplane bottom surface 361. In some embodiments, the backplane side surface 362 is inclined at an inclination angle A2 relative to the backplane bottom surface 361, and the inclination angle A2 is different from the inclination angle A1. For example, the inclination angle A2 may be less than the inclination angle A1. In some other embodiments, the inclination angle A2 may be substantially the same as the inclination angle A1, but it is not limited thereto.

The side surface 332 of the reflector 330 has a light-absorbing region 3321 and a plurality of light-absorbing elements 370. The light-absorbing elements 370 are in the light-absorbing region 3321. The light-absorbing elements 370 in the light-absorbing region 3321 are used for absorbing light, so as to improve the illumination uniformity of the display panel 200. It should be noted that "the light-absorbing elements 370 in the same row" refer to the light-absorbing elements 370 at the same height relative to the bottom surface 331 of the reflector 330. The light-absorbing elements 370 in different rows may include the same or different numbers, sizes (such as diameters, areas), color shades, arrangements, etc., but the commonalities and differences are not limited thereto. Generally, if the light-absorbing elements 370 in the same row are more in number, larger in size (larger in area), darker in color, or higher in density, more light is absorbed. The numbers, sizes, color shades, and arrangements of light-absorbing elements may be determined according to actual needs.

Moreover, the range of the light-absorbing region 3321 that is used for absorbing light may be determined according to actual needs. In some embodiments, the range of the light-absorbing region 3321 is related to the beam angle θ of the light-emitting elements 340. In detail, the light-emitting elements 340 may emit light toward different directions and different positions. At a certain position, the corresponding beam angle θ is the angle between a connecting line passing through this position and the central point 341 of the corresponding light-emitting element 340 and a front view direction (the z-axis). In some embodiments, the light-absorbing region 3321 is the region on the side surface 332 of the reflector 330 that corresponds to the beam angle θ ranging from 45 degrees to 90 degrees (45°≤beam angle θ≤90°). In addition, the horizontal distance Dx, the vertical distance Dy, and the height OD may be measured from a certain light-absorbing element 370 to the central point 341 of one of the light-emitting elements 340, and the beam angle θ corresponding to this light-absorbing element 370 may be calculated accordingly (for example, by arctangent). In detail, the horizontal distance Dx is substantially parallel with the x-axis, and the vertical distance Dy is substantially parallel with the y-axis.

In some embodiments, the maximum illuminance of the light-emitting elements 340 is normalized, for example, the maximum illuminance is normalized to be 1, and the range of the expected light-absorbing region 3321 may be found accordingly. In some embodiments, in circumstances where the illuminance is greater than one third of the maximum illuminance (i.e., approximately 0.33), the corresponding beam angle θ is regarded as "a selected design angle", but it is not limited thereto. The range of the desired light-absorbing region 3321 may correspond to the selected design angle. In some other embodiments, for the circumstances that the illuminance is greater than one half or one fourth of the maximum illuminance or other values, the corresponding beam angle θ may be regarded as the selected design angle, but the value is not limited thereto.

Figure 3:
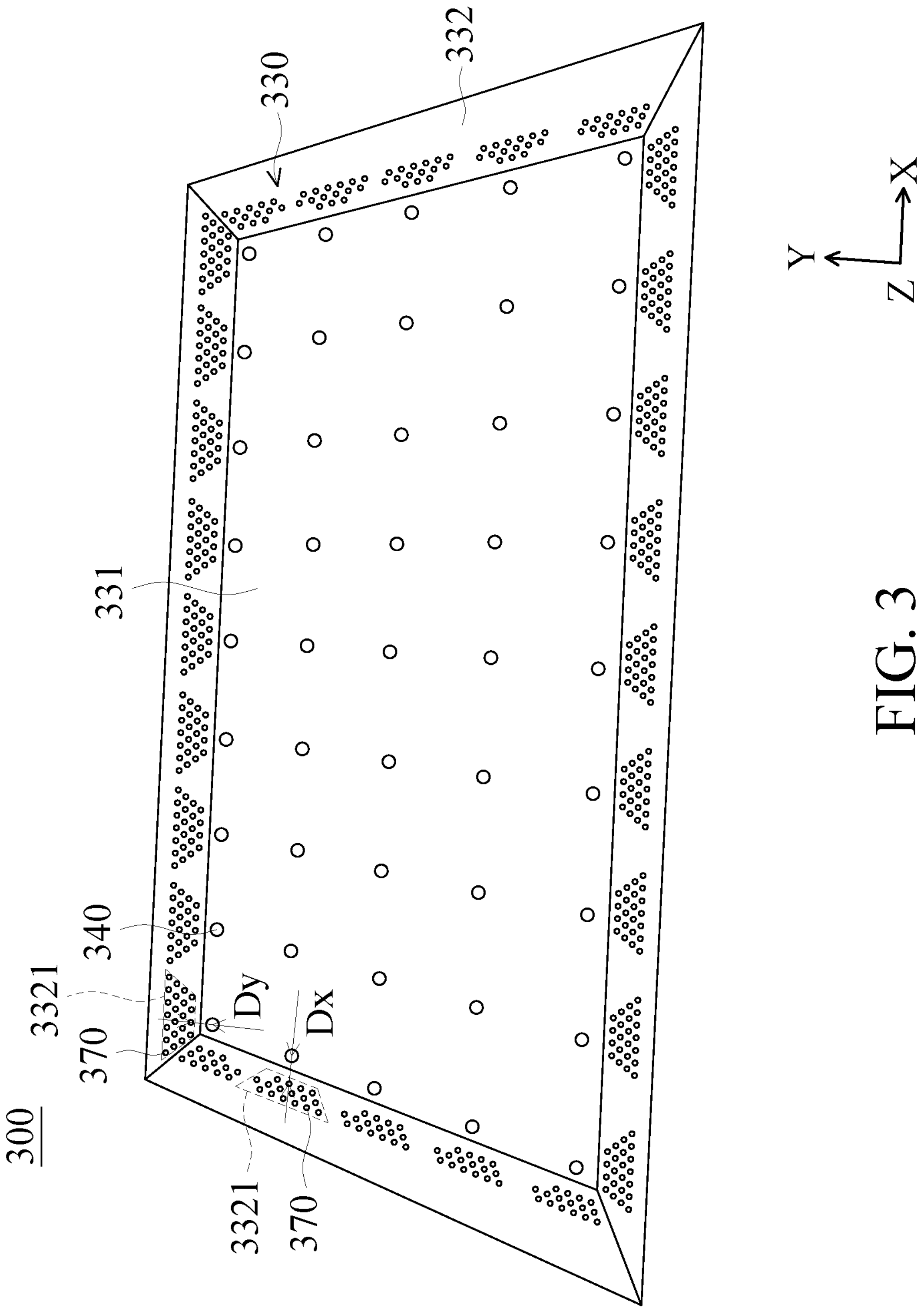
FIG. 3 is a perspective view of the light-emitting module, in accordance with some embodiments of the present disclosure.
Figure 4:
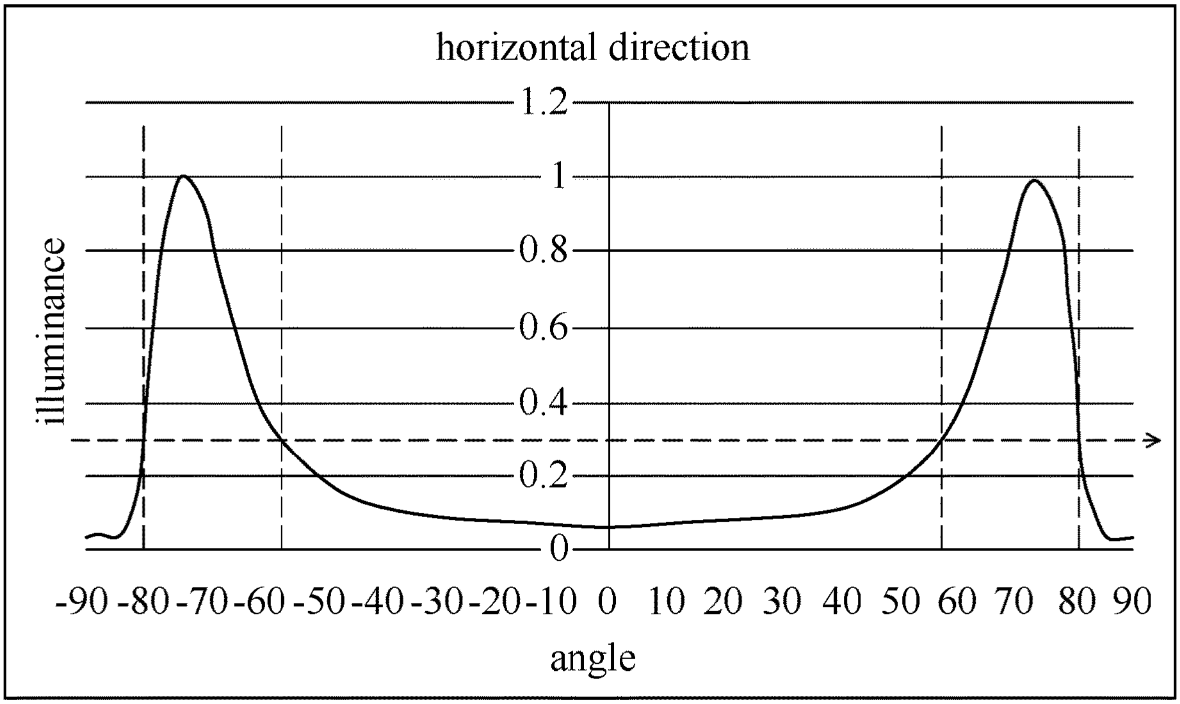
FIG. 4 and FIG. 5 are views showing the relationship between the illuminance of the light-emitting elements in FIG. 3 and their beam angles in the horizontal direction and the vertical direction, respectively.
Figure 5:
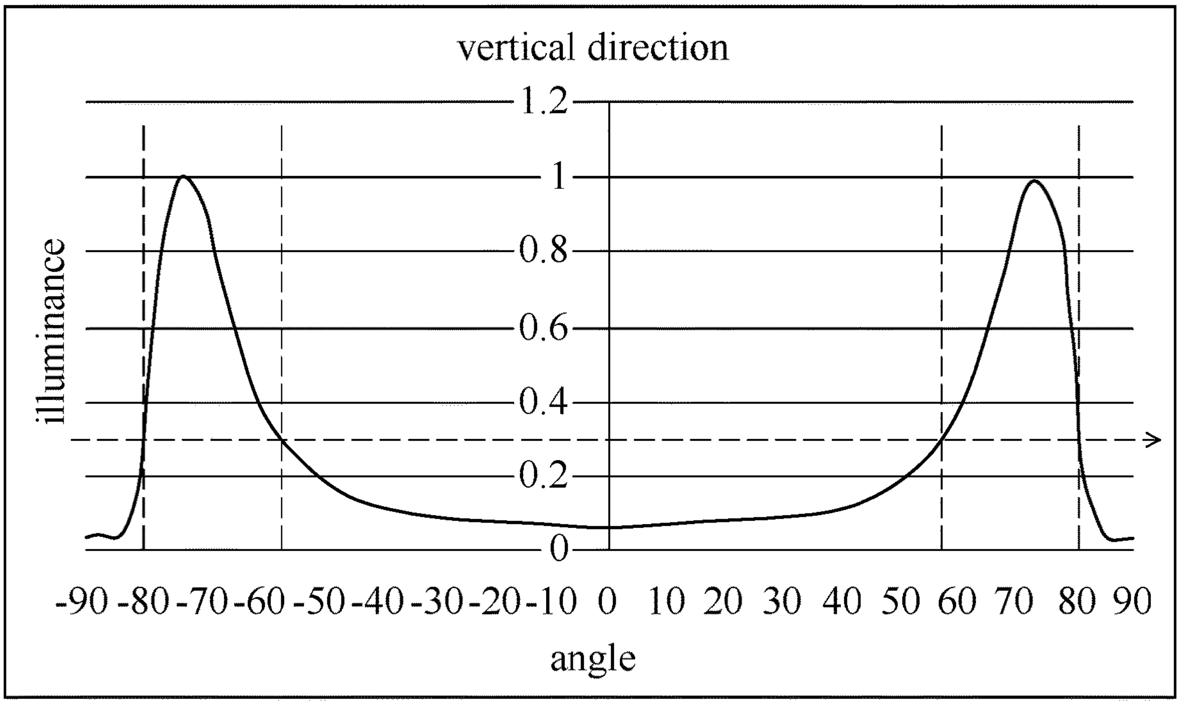

Next, please refer to FIG. 3 to FIG. 5. FIG. 3 FIG. 3 is a perspective view of the light-emitting module 300, in accordance with some embodiments of the present disclosure. FIG. 4 and FIG. 5 are views showing the relationship between the illuminance of the light-emitting elements 340 in FIG. 3 and their beam angles in the horizontal direction and the vertical direction, respectively. In this embodiment, the light-absorbing elements 370 are a plurality of openings. For example, the light-absorbing elements 370 may be formed on the side surface 332 while the reflector 330 is formed. In this embodiment, the light-absorbing region 3321 is substantially trapezoidal, including the multiple light-absorbing elements 370. The light-absorbing elements 370 may be circular, but the shapes of the light-absorbing elements 370 are not limited thereto.

As shown in FIG. 4, in the horizontal direction (x-axis), in circumstances where the illuminance is greater than one third of the maximum illuminance, the corresponding beam angle θ (the selected design angle) is between about 60 degrees and about 80 degrees. As shown in FIG. 5, in the vertical direction (y-axis), in circumstances where the illuminance is greater than one third of the maximum illuminance, the corresponding beam angle θ (the selected design angle) is between about 58 degrees and about 80 degrees.

In addition, according to the beam angle θ that corresponds to the maximum illuminance of the light-emitting elements 340, a greater number of light-absorbing elements 370 may be further provided, so that the light may be absorbed by such greater number of light-absorbing elements 370. In some embodiments, the greatest number of light-absorbing elements 370 is formed in a region where the corresponding beam angle θ corresponds to the maximum illuminance of the light-emitting elements 340 (with ±5 degrees range), but the forming region of the light-absorbing elements 370 is not limited thereto.

For example, as shown in FIG. 4, in the horizontal direction (x-axis), the beam angle θ that corresponds to the maximum illuminance of the light-emitting elements 340 is about 75 degrees. Therefore, in the horizontal direction (x-axis), the number of light-absorbing elements 370 that are formed in the region where the beam angle θ of light-emitting elements 340 is about 75 degrees may be greater than the number of light-absorbing elements 370 that are formed in the region where the beam angle θ of light-emitting elements 340 corresponds to other degrees. Table 1 is provided below for reference:

TABLE 1

| Dx (mm) | OD (mm) | the corresponding angle θ in the horizontal direction | illuminance | the number of light-absorbing elements |
|---|---|---|---|---|
| 49 | 13 (a higher row) | 75 | higher | greater |

TABLE 1-continued

| Dx (mm) | OD (mm) | the corresponding angle θ in the horizontal direction | illuminance | the number of light-absorbing elements |
|---|---|---|---|---|
| 33 | 4 (a lower row) | 83 | lower | less |

Similarly, as shown in FIG. 5, in the vertical direction (y-axis), the beam angle θ that corresponds to the maximum illuminance of the light-emitting elements 340 is about 76 degrees. Therefore, in the vertical direction (y-axis), the number of light-absorbing elements 370 that are formed in the region where the beam angle θ of light-emitting elements 340 is about 76 degrees may be greater than the number of light-absorbing elements 370 that are formed in the region where the beam angle θ of light-emitting elements 340 corresponds to other degrees. Table 2 is provided below for reference:

TABLE 2

| Dy (mm) | OD (mm) | the corresponding angle θ in the vertical direction | illuminance | the number of light-absorbing elements |
|---|---|---|---|---|
| 52 | 13 (a higher row) | 76 | higher | greater |
| 35 | 4 (a lower row) | 83 | lower | less |

As described above, the light-absorbing elements 370 may be sorted into a plurality of rows, and the number of light-absorbing elements 370 may be different in different rows. For example, in the embodiments illustrated in FIG. 3 to FIG. 5, a first number of light-absorbing elements 370 are in the highest row, a second number of light-absorbing elements 370 are in the lowest row, and the first number is greater than the second number. In some embodiments, in the light-absorbing region 3321 of the side surface 332 of the reflector 330, the number of light-absorbing elements 370 decreases as the height decreases, but the change in the number of light-absorbing elements 370 is not limited thereto. In some embodiments, the light is projected onto the highest row with its beam angle θ corresponding to the maximum illuminance, but it is not limited thereto.

Figure 6:
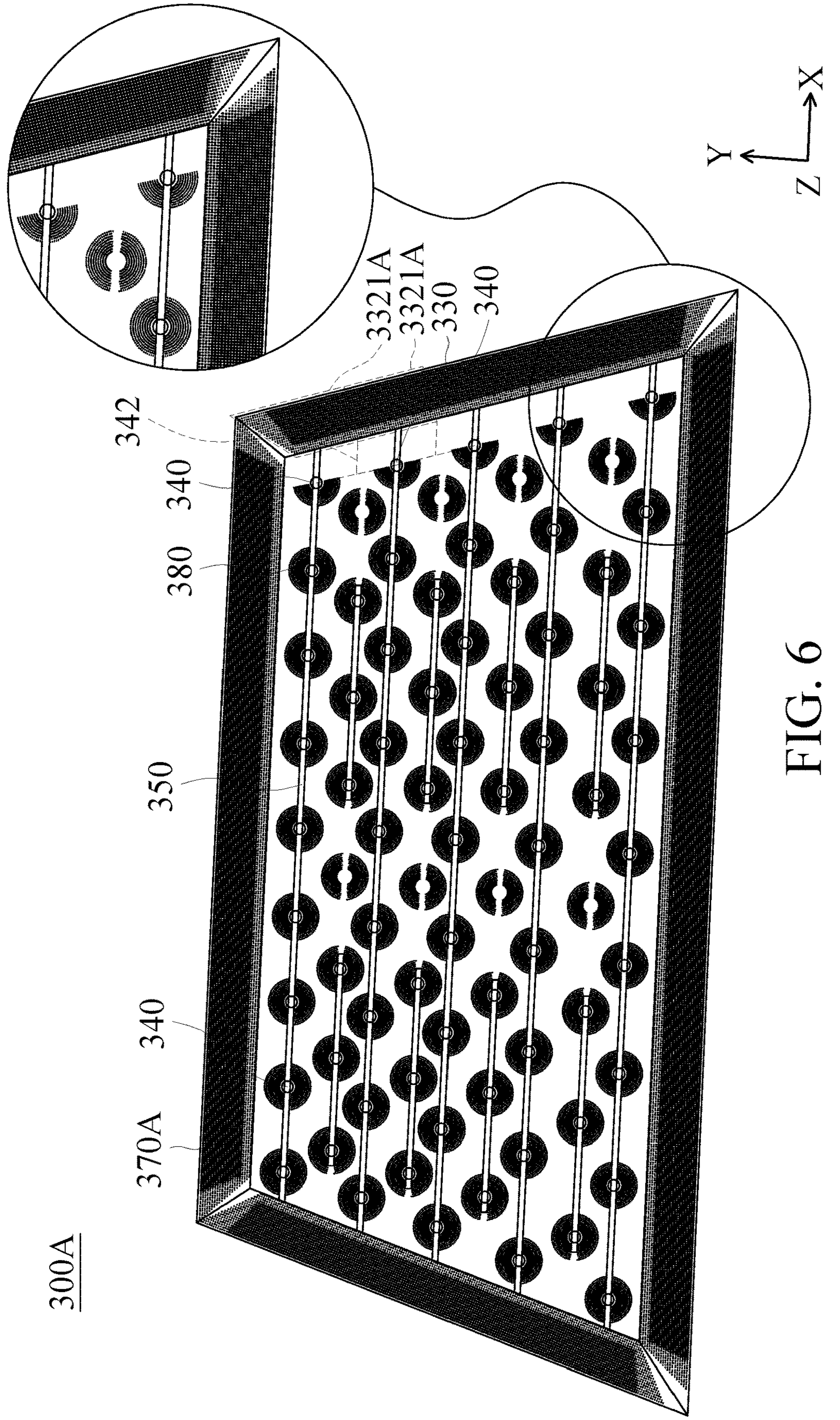
FIG. 6 is a perspective view of the lighting module, in accordance with some embodiments of the present disclosure.
Figure 7:
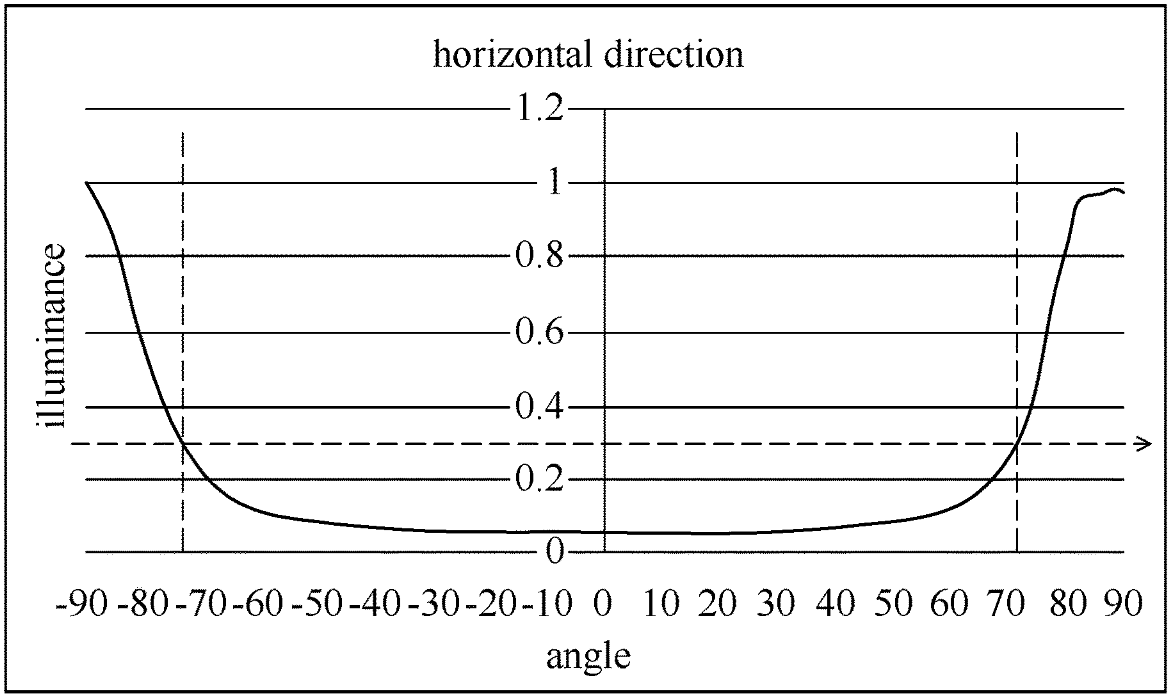
FIG. 7 and FIG. 8 are views showing the relationship between the illuminance of the light-emitting elements in FIG. 6 and their beam angles in the horizontal direction and the vertical direction, respectively.
Figure 8:
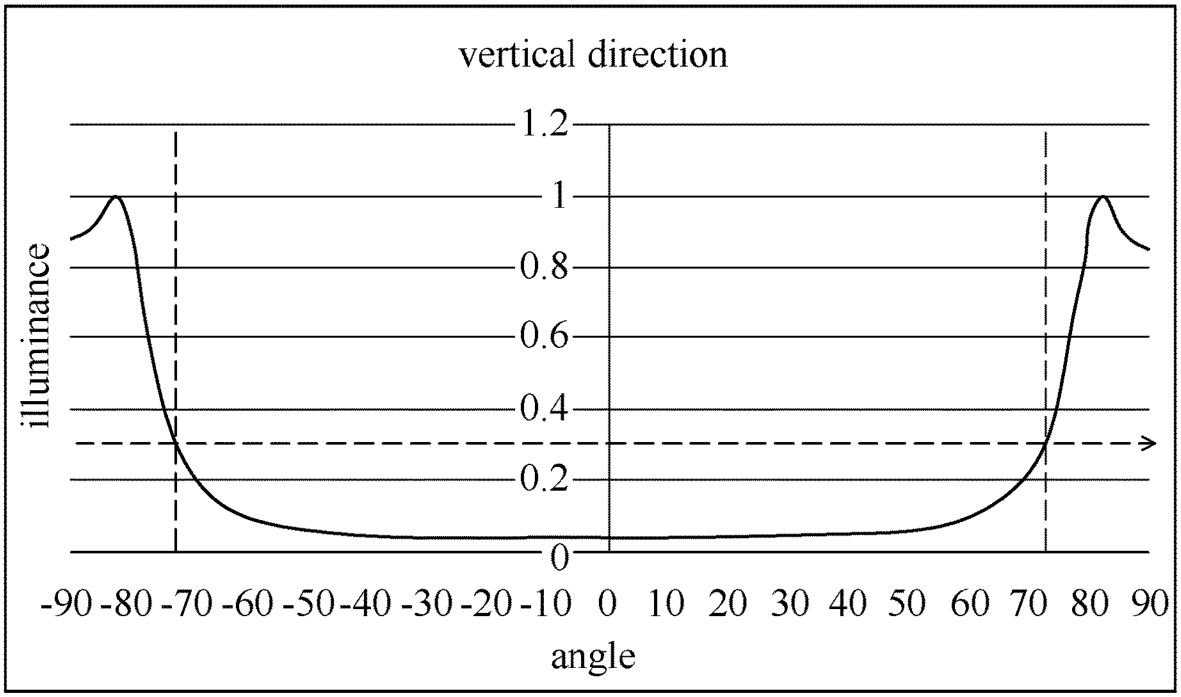

In the following description, identical or similar elements will be denoted by identical or similar symbols. Please refer to FIG. 6 to FIG. 8. FIG. 6 is a perspective view of a lighting module 300A, in accordance with some embodiments of the present disclosure. FIG. 7 and FIG. 8 are views showing the relationship between the illuminance of a plurality of light-emitting elements 340 in FIG. 6 and their beam angles in the horizontal direction and the vertical direction, respectively. In this embodiment, the light-absorbing elements 370A are a plurality of printed patterns. For example, desired patterns may be printed on the side surface 332 of the reflector 330, but the methods for forming the patterns are not limited thereto. The light-absorbing elements 370A may be black, grayscale, or may gradually go from light to dark, etc., but the color of the light-absorbing elements 370A is not limited thereto. The side surface 332 of the reflector 330 has a light-absorbing region 3321A and a plurality of light-absorbing elements 370A. The light-absorbing elements 370A are in the light-absorbing region 3321A.

It should be noted that the light-absorbing region(s) may or may not have obvious boundaries. In some embodiments (for example, as shown in FIG. 3), each light-absorbing region 3321 has a clear boundary, and its range may be regarded as the area surrounded by the boundary around the outermost light-absorbing elements 370. Also, in some other embodiments (for example, as shown in FIG. 6), each light-absorbing region 3321A does not have a clear boundary, and the boundary between two adjacent light-absorbing regions 3321A may be defined by an extension line 342. The extension line 342 may be a line extending from the center line between adjacent light-emitting elements 340 to the side surface 332 of the reflector 330.

Figure 9:
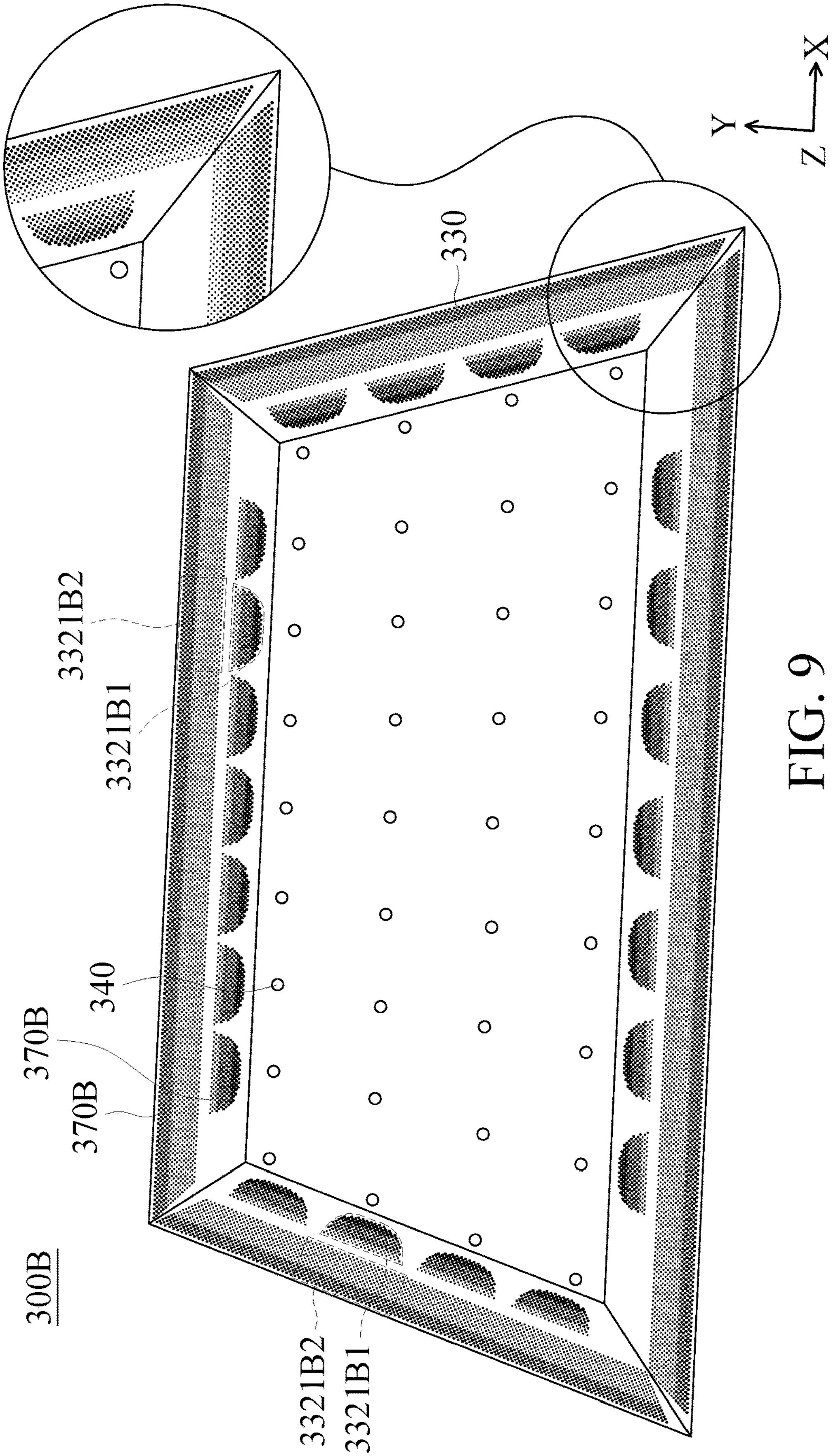
FIG. 9 to FIG. 11 are perspective views of the light-emitting module, in accordance with some embodiments of the present disclosure.

In addition, the side surface 332 of the reflector 330 may include a light-absorbing region with a clear boundary and a light-absorbing region without a clear boundary (for example, as shown FIG. 9). The light-absorbing regions that do not have clear boundaries may represent that these light-absorbing regions have portions connected to each other. On the side surface 332 of the reflector 330, the region except for the light-absorbing regions may be referred to as a reflective region. The reflective region may cause light reflection. In some embodiments, the reflectivity of the reflective region may be above 90%, such as 95%, 97%, or 99%, but it not limited thereto.

As shown in FIG. 7, in the horizontal direction (x-axis), in circumstances where the illuminance is greater than one third of the maximum illuminance, the corresponding beam angle θ (the selected design angle) is between about 72 degrees and about 90 degrees. As shown in FIG. 8, in the vertical direction (y-axis), in circumstances where the illuminance is greater than one third of the maximum illuminance, the corresponding beam angle θ (the selected design angle) is between about 72 degrees and about 90 degrees.

In addition, according to the beam angle θ that corresponds to the maximum illuminance of the light-emitting elements 340, light-absorbing elements 370A with larger sizes may be further provided, so that the light may be absorbed by such larger-sized light-absorbing elements 370. In some embodiments, the largest light-absorbing element 370 is formed in a region where the corresponding beam angle θ corresponds to the maximum illuminance of the light-emitting elements 340 (with ±5 degrees range), but the forming region of the light-absorbing elements 370 is not limited thereto.

For example, as shown in FIG. 7, in the horizontal direction (x-axis), the beam angle θ that corresponds to the maximum illuminance of the light-emitting elements 340 is about 82 degrees. Therefore, in the horizontal direction (x-axis), the sizes of the light-absorbing elements 370A that are formed in the region where the beam angle θ of light-emitting elements 340 is about 82 degrees may be larger than the sizes of the light-absorbing elements 370A that are formed in the region where the beam angle θ of light-emitting elements 340 corresponds to other degrees. Table 3 is provided below for reference:

TABLE 3

| Dx (mm) | OD (mm) | the corresponding angle θ in the horizontal direction | illuminance | the sizes of the light-absorbing elements |
|---|---|---|---|---|
| 100 | 14 (a higher row) | 82 | higher | larger |
| 43 | 2 (a lower row) | 87 | lower | smaller |

Similarly, as shown in FIG. 8, in the vertical direction (y-axis), the beam angle θ that corresponds to the maximum illuminance of the light-emitting elements 340 is about 87 degrees. Therefore, in the vertical direction (y-axis), the sizes of the light-absorbing elements 370A that are formed in the region where the beam angle θ of light-emitting elements 340 is about 87 degrees may be greater than the sizes of the light-absorbing elements 370A that are formed in the region where the beam angle θ of light-emitting elements 340 corresponds to other degrees. Table 4 is provided below for reference:

TABLE 4

| Dy (mm) | OD (mm) | the corresponding angle θ in the vertical direction | illuminance | the sizes of the light-absorbing elements |
|---|---|---|---|---|
| 106 | 14 (a higher row) | 82 | higher | larger |
| 48 | 2 (a lower row) | 87 | lower | smaller |

As described above, the sizes of the light-absorbing elements 370 may be different in different rows. For example, in the embodiments illustrated in FIG. 6 to FIG. 8, the size of a first light-absorbing element that is in a higher row is larger than the size of a second light-absorbing element that is in a lower row. For example, the diameter of a first light-absorbing element that is in a higher row is larger than the diameter of a second light-absorbing element that is in a lower row. Alternatively, the area of a first light-absorbing element that is in a higher row is larger than the area of a second light-absorbing element that is in a lower row. In some embodiments, in the light-absorbing region 3321A of the side surface 332 of the reflector 330, the sizes of the light-absorbing elements 370 decrease as the height decreases, but the change in sizes of the light-absorbing elements 370 is not limited thereto. In some embodiments, the light is projected onto the first light-absorbing element with its beam angle θ corresponding to the maximum illuminance, but it is not limited thereto.

It should be noted that, as shown in FIG. 6, a plurality of characteristic patterns 380 may be formed on the bottom surface 331 of the reflector 330. The characteristic patterns 380 may be used to scatter or absorb light, so as to further improve the illumination uniformity of the display panel 200. In some embodiments, the characteristic patterns 380 and the light-absorbing elements 370A are formed in the same process. In some embodiments, the characteristic patterns 380 may be circular patterns surrounding the light-emitting elements 340. In some embodiments, the characteristic patterns 380 may be semicircular patterns partially surrounding the light-emitting elements 340. In some embodiments, the characteristic patterns 380 do not surround the light-emitting elements 340, and the characteristic patterns 380 are formed separately on the bottom surface 331 of the reflector 330. In some embodiments, the characteristic patterns 380 may include a plurality of dot units, and the dots are denser at the central portion of the characteristic patterns 380 than at the peripheral portion of the characteristic patterns 380, but the arrangements of the dots is not limited thereto. In some other embodiments, the characteristic patterns 380 may include a plurality of ring units, but the pattern units are not limited thereto.

Figure 10:
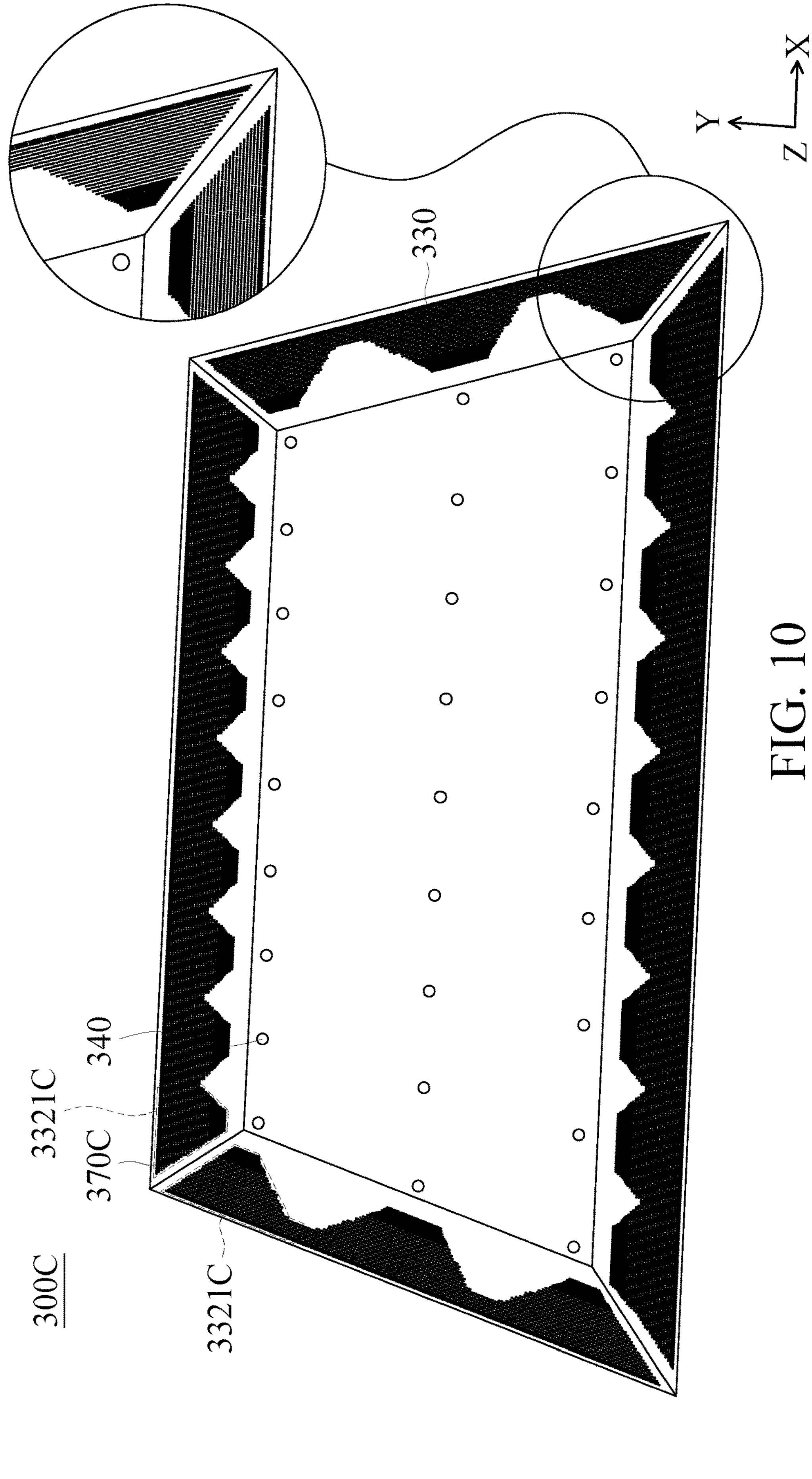
Figure 11:
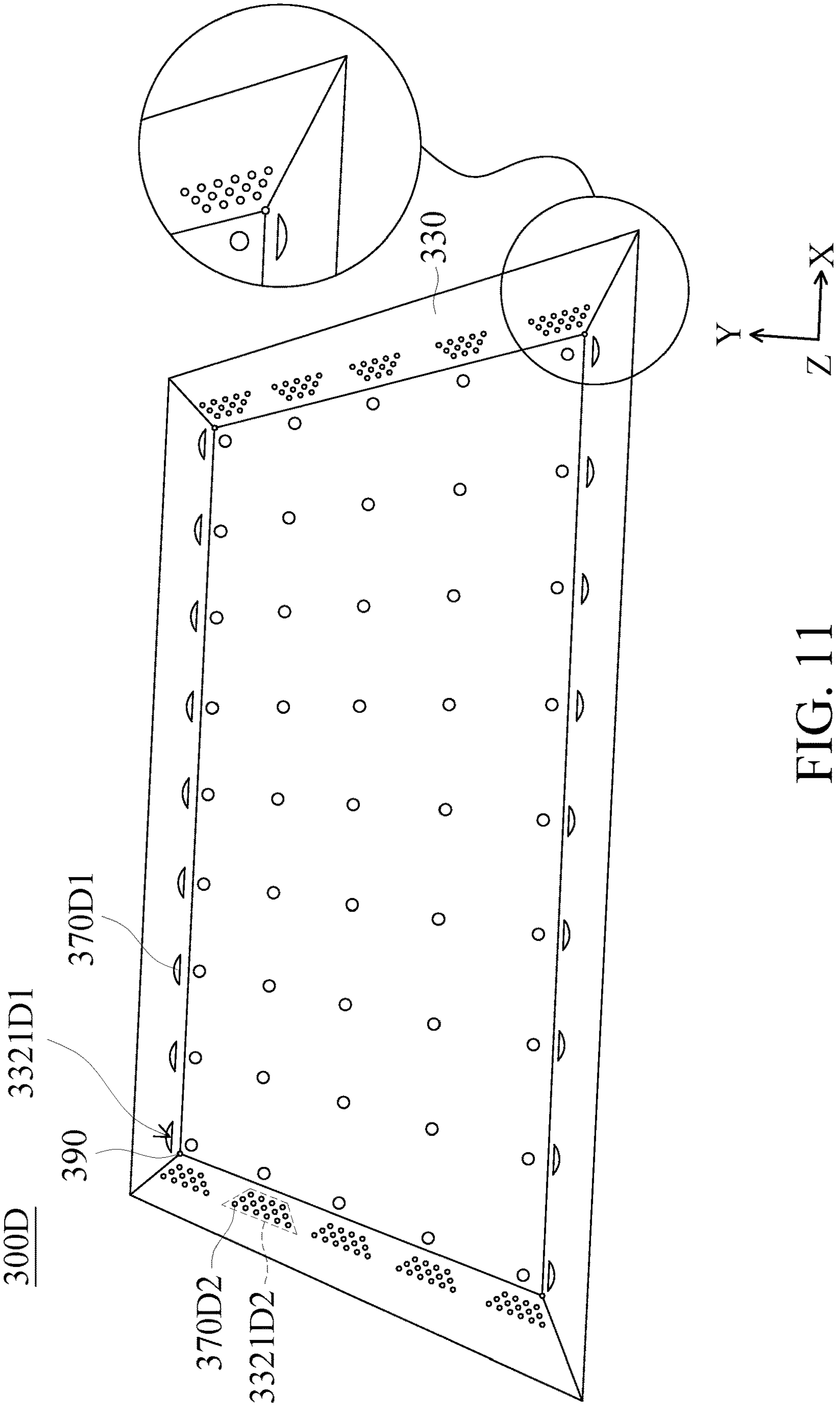

Next, please refer to FIG. 9 to FIG. 11. FIG. 9 to FIG. 11 are perspective views of light-emitting modules 300B, 300C, and 300D, in accordance with some embodiments of the present disclosure. The light-emitting module 300B includes a plurality of light-absorbing elements 370B arranged in both a light-absorbing region 3321B1 and a light-absorbing region 3321B2. The light-emitting module 300C includes a plurality of light-absorbing elements 370C in a light-absorbing region 3321C. The light-emitting module 300D includes a light-absorbing element 370D1 disposed in a light-absorbing region 3321D1 and a plurality of light-absorbing elements 370D2 disposed in a light-absorbing region 3321D2.

As shown in FIG. 9, the light-absorbing region 3321B1 is at a lower position on the side surface 332 of the reflector 330 (relatively close to the light-emitting elements 340), and the light-absorbing region 3321B2 is at a higher position on the side surface 332 of the reflector 330 (relatively far away from the light-emitting elements 340). The light-absorbing elements 370B in the light-absorbing region 3321B1 and the light-absorbing elements 370B in the light-absorbing region 3321B2 may have different sizes, color shades, and/or arrangements. For example, the light-absorbing elements 370B in the light-absorbing region 3321B1 have larger sizes, darker colors, and denser arrangements at lower positions and smaller sizes, lighter colors, and sparser arrangements at higher positions. Also, the light-absorbing elements 370B in the light-absorbing region 3321B2 have smaller sizes, lighter colors, and sparser arrangements at lower positions and larger sizes, darker colors, and denser arrangements at higher positions.

As shown in FIG. 10, each light-absorbing region 3321C is substantially polygonal, and the bottoms of these polygons are connected, in which the light-absorbing elements 370C in the light-absorbing region 3321C have denser arrangements at lower positions. As shown in FIG. 11, the light-absorbing regions 3321D1 are located on two opposite sides of the reflector 330, and the light-absorbing regions 3321D2 are located on the other two opposite sides of the reflector 330. Each light-absorbing region 3321D1 is substantially arc-shaped, including a single light-absorbing element 370D1 that is also arc-shaped. Each light-absorbing region 3321D2 is substantially trapezoidal, including multiple light-absorbing elements 370D2. In this embodiment, the light-absorbing elements 370D2 are circular. In addition, a hole 390 may be formed at the corner(s) of the reflector 330 to facilitate affixing or connecting the reflector 330 to the backplane 360.

Figure 12A:
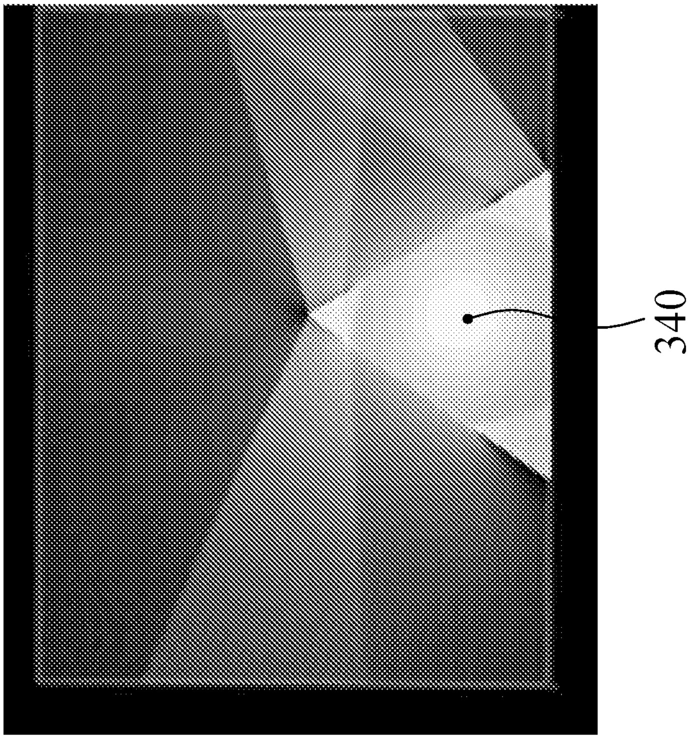
FIG. 12A to FIG. 12C are views of light-absorbing elements with different profiles, in accordance with some embodiments of the present disclosure.
Figure 12B:
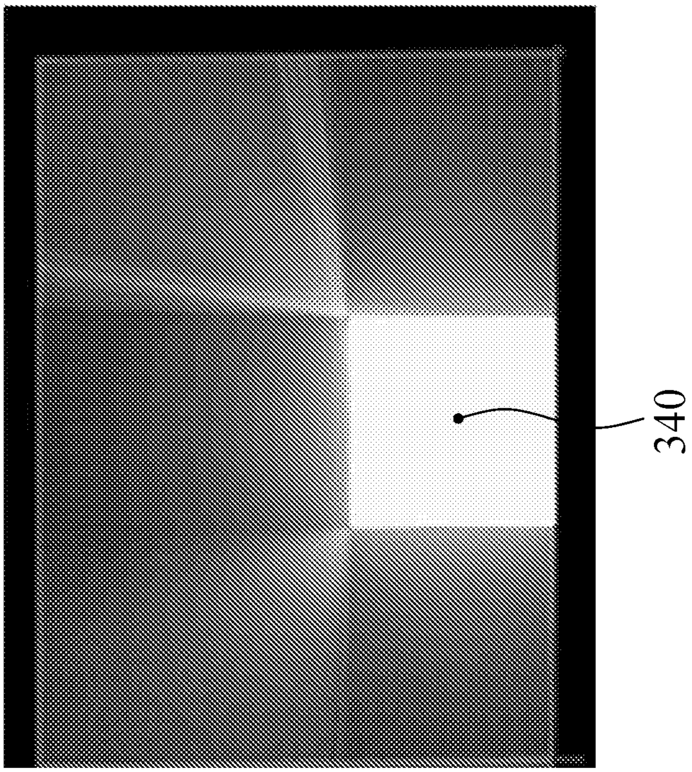
Figure 12C:
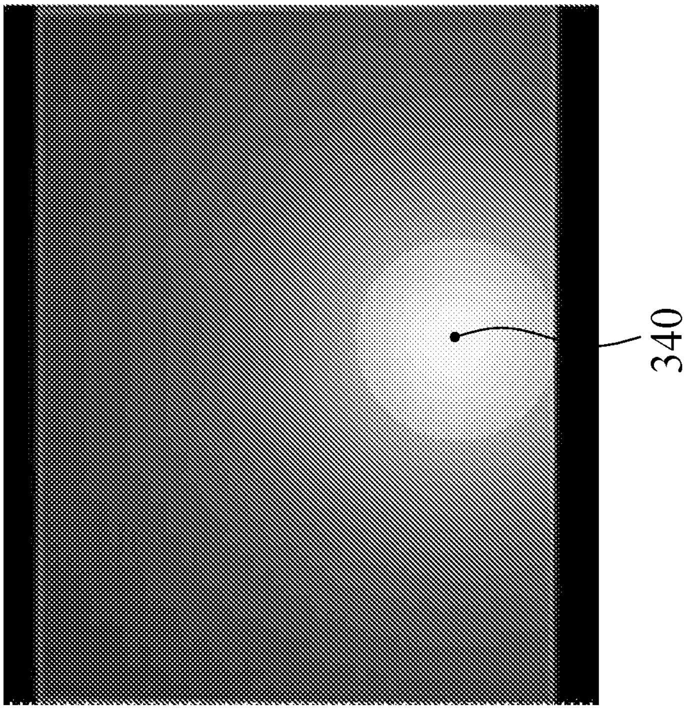

Next, please refer to FIG. 12A to FIG. 12C. FIG. 12A to FIG. 12C are views of the light-absorbing element (for example, including but not limited to the light-absorbing elements 370, 370A, 370B, 370C, and 370D) with different profiles, in accordance with some embodiments of the present disclosure. In FIG. 12A to FIG. 12C, the light-absorbing element is substantially triangular, quadrilateral, and circular, respectively. As shown in FIG. 12A and FIG. 12B, when the light-absorbing element has a sharper angle, the light may gather at the sharper angle. Therefore, when the light-absorbing element has a relatively smooth shape, illumination uniformity of the display panel may be further improved. In some embodiments, at least one of the light-absorbing elements has a curved profile. In some embodiments, at least one of the light-absorbing elements is circular or elliptical in shape.

The foregoing outlines features of several embodiments, so that those skilled in the art may better understand the aspects of this disclosure. Those skilled in the art should appreciate that they may readily use this disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of this disclosure. In addition, the scope of this disclosure is not limited to the specific embodiments described in the specification, and each claim constitutes a separate embodiment, and the combination of various claims and embodiments are within the scope of the disclosure.

What is claimed is:

1. A light-emitting module, comprising:

a backplane;

a light-emitting element disposed on the backplane; and a reflector disposed on the backplane, adjacent to the light-emitting element, and comprising a bottom surface and a side surface surrounding the bottom surface, wherein the side surface has a plurality of light-absorbing elements, wherein the reflector comprises a light-absorbing region, the light-absorbing elements are located in the light-absorbing region, light emitted by the light-emitting element is projected onto the light-absorbing region at a beam angle, and the beam angle is between 45 degrees and 90 degrees, and wherein the light-absorbing elements are sorted into a plurality of rows comprising a highest row and a lowest row, a first number of light-absorbing elements are in the highest row, a second number of light-absorbing elements are in the lowest row, and the first number is greater than the second number.

2. The light-emitting module as claimed in claim 1, wherein the light-absorbing elements are a plurality of printed patterns.

3. The light-emitting module as claimed in claim 1, wherein the light-absorbing elements are a plurality of openings.

4. The light-emitting module as claimed in claim 1, wherein the beam angle in a horizontal direction or a vertical direction is calculated by a horizontal distance or a vertical distance and a height from one of the light-absorbing elements to a central point of the light-emitting element.

5. The light-emitting module as claimed in claim 1, wherein the light-emitting element is used for emitting light, the light has a greatest illuminance at a first beam angle, and the light is projected onto the highest row at the first beam angle.

6. The light-emitting module as claimed in claim 1, wherein at least one of the light-absorbing elements has a curved profile.

7. The light-emitting module as claimed in claim 1, wherein at least one of the light-absorbing elements is circular or elliptical in shape.

8. The light-emitting module as claimed in claim 1, wherein the side surface is inclined at a first inclination angle relative to the bottom surface, and the first inclination angle is greater than or equal to 100 degrees and less than or equal to 170 degrees.

9. The light-emitting module as claimed in claim 8, wherein the backplane comprises a backplane bottom surface and a backplane side surface surrounding the backplane bottom surface, the backplane side surface is inclined at a second inclination angle relative to the backplane bottom surface, and the first inclination angle is different from the second inclination angle.

10. The light-emitting module as claimed in claim 1, wherein the light-absorbing elements comprise a first light-absorbing element and a second light-absorbing element, the first light-absorbing element is higher than the second light-absorbing element relative to the bottom surface, and an area of the first light-absorbing element is different from an area of the second light-absorbing element.

11. The light-emitting module as claimed in claim 10, wherein the area of the first light-absorbing element is greater than the area of the second light-absorbing element.

12. The light-emitting module as claimed in claim 10, wherein the light-emitting element is used for emitting light, the light has a greatest illuminance at a first beam angle, and the light is projected onto the first light-absorbing element at the first beam angle.

13. The light-emitting module as claimed in claim 1, further comprising a plurality of characteristic patterns formed on the bottom surface of the reflector.

14. The light-emitting module as claimed in claim 13, wherein the characteristic patterns at least partially surround the light-emitting element.

15. The light-emitting module as claimed in claim 1, wherein the reflector comprises a lower light-absorbing region and a higher light-absorbing region separated from each other by a distance, the lower light-absorbing region is closer to the light-emitting element than the higher light-absorbing region, and the light-absorbing elements are located in both the lower light-absorbing region and the higher light-absorbing region.

16. The light-emitting module as claimed in claim 15, wherein the light-absorbing elements that are in the lower light-absorbing region and the light-absorbing elements that are in the higher light-absorbing region have different sizes, color shades, or arrangements.

17. The light-emitting module as claimed in claim 15, further comprising a reflective region adjacent to at least one of the lower light-absorbing region and the higher light-absorbing region and without light-absorbing elements, and reflectivity of the reflective region is greater than or equal to 90%.

18. A light-emitting module, comprising:

a backplane;

a light-emitting element disposed on the backplane; and a reflector disposed on the backplane, adjacent to the light-emitting element, and comprising a bottom surface and a side surface surrounding the bottom surface, wherein the side surface has a plurality of light-absorbing elements, wherein the reflector comprises a light-absorbing region, the light-absorbing elements are located in the light-absorbing region, light emitted by the light-emitting element is projected onto the light-absorbing region at a beam angle, and the beam angle is between 45 degrees and 90 degrees, wherein the light-absorbing elements are sorted into a plurality of rows comprising a highest row and a lowest row, a first number of light-absorbing elements are in the highest row, a second number of light-absorbing elements are in the lowest row, and the first number is different from the second number, and wherein the light-emitting element is used for emitting light, the light has a greatest illuminance at a first beam angle, and the light is projected onto the highest row at the first beam angle.

19. A light-emitting module, comprising:

a backplane;

a light-emitting element disposed on the backplane; and a reflector disposed on the backplane, adjacent to the light-emitting element, and comprising a bottom surface and a side surface surrounding the bottom surface, wherein the side surface has a plurality of light-absorbing elements, wherein the reflector comprises a light-absorbing region, the light-absorbing elements are located in the light-absorbing region, light emitted by the light-emitting element is projected onto the light-absorbing region at a beam angle, and the beam angle is between 45 degrees and 90 degrees, wherein the light-absorbing elements comprise a first light-absorbing element and a second light-absorbing element, the first light-absorbing element is higher than the second light-absorbing element relative to the bottom surface, and an area of the first light-absorbing element is different from an area of the second light-absorbing element, and wherein the light-emitting element is used for emitting light, the light has a greatest illuminance at a first beam angle, and the light is projected onto the first light-absorbing element at the first beam angle.

* * * * *